United States Patent [19]

Fujii et al.

[11] Patent Number: 5,578,862
[45] Date of Patent: Nov. 26, 1996

[54] SEMICONDUCTOR INTEGRATED CIRCUIT WITH LAYER FOR ISOLATING ELEMENTS IN SUBSTRATE

[75] Inventors: Nobuo Fujii, Yokohama; Yosuke Mizukawa; Yasuo Mitsuhashi, both of Nagaokakyo, all of Japan

[73] Assignee: Mitsubishi Denki Kabushiki Kaisha, Tokyo, Japan

[21] Appl. No.: 322,374

[22] Filed: Oct. 13, 1994

Related U.S. Application Data

[63] Continuation of Ser. No. 998,853, Dec. 30, 1992, abandoned.
[51] Int. Cl.⁶ .................................................. H01L 29/00
[52] U.S. Cl. ...................... 257/547; 257/552; 257/551; 257/532; 327/382; 327/482
[58] Field of Search ...................... 257/547, 551, 257/552, 544, 545, 370, 532; 327/382, 482

[56] References Cited

U.S. PATENT DOCUMENTS 4,935,796  6/1990  Zuffada et al. ............................ 257/545
4,979,008  12/1990  Siligoni et al. .......................... 257/547
5,051,612  9/1991  Agiman ..................................... 257/547
5,179,432  1/1993  Husher ..................................... 257/552

FOREIGN PATENT DOCUMENTS 449093  10/1991  European Pat. Off. ..
1261856  10/1989  Japan .

OTHER PUBLICATIONS

Revised Edition: Integrated Circuit Engineering (1) to Hisayoshi Yanai et al, published by Corona Publishing Co., Ltd., Apr. 30, 1987.
Toshiba Review, vol. 37, No. 13, 1982, pp. 1153–1158.

Primary Examiner—Sara W. Crane
Assistant Examiner—Courtney A. Bowers

[57] ABSTRACT

By reverse biasing the PN junction formed around a semiconductor element, the semiconductor element is isolated from other elements. The PN junction around the semiconductor element is a junction between a layer surrounding the semiconductor element and a layer disposed outside the layer. Jointly with the layer constituting the semiconductor, the layer surrounding the semiconductor element forms a parasitic diode. The potential of the layer on the semiconductor element to be connected to the layer surrounding the semiconductor element is detected, and based on this potential, the voltage to be applied to the parasitic diode is controlled so as to be constant. When the voltage to be applied to the parasitic diode is lower than a threshold, the parasitic diode will be in a cutoff state.

33 Claims, 4 Drawing Sheets

SEMICONDUCTOR INTEGRATED CIRCUIT WITH LAYER FOR ISOLATING ELEMENTS IN SUBSTRATE

This application is a continuation, continuation-in-part, of application Ser. No. 07/998,853 filed on Dec. 30, 1992, now abandoned.

BACKGROUND OF THE INVENTION

1. Field of the Invention

This invention relates to a semiconductor integrated circuit (hereinafter also called "IC"), and more particularly to a concept of reducing the possibility of a parasitic diode in an IC having an element isolating structure.

2. Description of the Related Art

FIG. 5 of the accompanying drawings is a cross-sectional view showing a typical IC. The IC has a PNP bipolar transistor 10 formed in a P substrate 12.

in the P substrate 12, an $N^+$ implanted layer 16 is formed by, for example, ion implantation. Formed over the $N^+$ implanted layer 16 is a $P^+$ layer 18 on which an N epitaxial layer 20 is formed. An $N^+$ layer 22 and a P layer 24 are formed in the N epitaxial layer 20. The PNP transistor 10 consists of the $P^+$ layer 18, the N epitaxial layer 20 and the P layer 24 as the collector layer, base layer and emitter layer, respectively. The $N^+$ layer 22 is the base contact layer of the PNP transistor 10.

The PNP transistor 10, around which an N expitaxial layer 26 is formed, is contiguous to other elements ( such as transistors and diodes) via a diffusion layer 28. Only parts (N epitaxial layers 30 and 32) of the other elements contiguous to the PNP transistor 10 are illustrated in FIG. 5. The diffusion layer 28 is a so-called element-isolating layer for electrically isolating the PNP transistor 10 from the other elements horizontally in FIG. 5 and may be extensively used in circuit-isolation.

in the manufacture of the IC of FIG. 5, the foregoing layers 14 through 32 are formed in the P substrate 12, and then an insulating film 34 is formed in a predetermined pattern on the surface of the P substrate 12. If silicon is used as the substance of the P substrate 12, the insulating film 34 is usually formed by a surface oxidation process. The insulating film 34 to be obtained by the surface oxidation process is a silicon oxide film. Upon forming the silicon oxide film 34, a conductive layer is formed in a predetermined pattern on the top surface of the P substrate 12. The substance of the conductive layer is usually metal.

Part of the conductive layer pattern is used as a collector electrode 36, a base electrode 38 or an emitter electrode 40 of the PNP transistor 10. The collector electrode 36, the base electrode 38 and the emitter electrode 40 are formed respectively on the collector layer 18, the base layer 20 via the base contact layer 22, and the emitter layer 24. A collector terminal 42, a base terminal 44 and an emitter terminal 46 are connected to the collector electrode 36, the base electrode 38 and emitter electrode 40, respectively.

Part of the conductive layer pattern is used in applying a supply voltage to the N epitaxial layer 26 and connecting the element-isolating layer 28 to ground; that is, a positive d.c. voltage from a battery 50 is applied to the conductive layer 48 formed on the N epitaxial layer 26, and on the other hand, a conductive layer 52 formed on the element-isolating layer 28 is grounded. Therefore the junction between the N epitaxial layer 26 and the element-isolating layer 28 is reverse biased. The $N^+$ implanted layer 16 has the same potential as that of the conductive layer 52; therefore the junction between the N+ implanted layer 16 and the P substrate 12 is reverse biased. As a result, a current will stop flowing through these PN junctions; that is, as the result that these PNP junctions become insulate, the PNP transistor 10 will be electrically isolated from the elements contiguous to it. Usually a positive d.c. voltage is also applied to the N epitaxial layer 30, 32. In the case of a double-power-source-driven IC, the reverse biasing may be performed by either the positive power source or the negative power source.

Thus the N layer 26 around the PNP transistor 10 is essential to element isolation using the element-isolating layer 28, but the junction between the N epitaxial layer 26 and the collector layer 18 functions as a parasitic diode. FIG. 6 shows a parasitic diode 54 formed by this junction. As shown in FIG. 6, the junction between the N epitaxial layer 26 and the collector layer 18 forms a PN diode (i.e., the parasitic diode 54) connected to the collector of the PNP transistor 10. The parasitic diode 54 functions in an electrostatic capacity between the collector of the PNP transistor 10 and the battery 50. This electrostatic capacity would generally affect the frequency characteristic of the circuit. In fact, the junction between the N epitaxial layer 26 and the element-isolating layer 28 also functions as a parasitic diode, but this diode does not contribute to circuit operation; therefore this diode is omitted in FIG. 6 and the following description. "The diode does not contribute to" means that it does not appear on an equivalent circuit showing the connections between the individual elements formed in the P substrate 12.

SUMMARY OF THE INVENTION

It is therefore an object of this invention to provide a semiconductor integrated circuit which can realize isolation between elements or circuits, without forming a parasitic diode which affects the frequency characteristic of the circuit.

According to a first aspect of the invention, there is provide a semiconductor integrated circuit comprising: a semiconductor substrate; an isolation object element formed in the semiconductor substrate and adapted to be isolated from other elements formed in the semiconductor substrate; a first layer formed in the semiconductor substrate and surrounding the isolation object element and adapted to be connected with a part of the isolation object element as a PN junction; a second layer formed in the semiconductor substrate and arranged so as to be connected with the first layer as a PN junction; means for reverse biasing the junction of the first and second layers; means for detecting a potential change at the PN junction between the isolation object element and the first layer; and means for adjusting the potential of the first layer in such a manner so that the detected potential change may be canceled.

According to a second aspect of the invention, there is provided a semiconductor-element isolating structure comprising: an isolation object element to be isolated from other elements; a first layer surrounding the isolation object element and adapted to be connected with a part of the isolation object element as a PN junction; a second layer adapted to be connected with the first layer as a PN junction; means for reverse biasing the PN junction of the first and second layers; means for detecting a potential change at the PN junction between the isolation object element and the first layer; and means for adjusting the potential of the first layer so as to cancel the detected potential change.

With these arrangements, the PN junction between the first and second layers is reverse biased and a current flowing through the junction is cutoff. Then, the isolation object element is isolated from other elements. With these arrangements, at least part of the isolation object element is connected to the first layer in PN junction. The potential change at this part is detected for adjusting the potential of the first layer; that is, when the potential change at the junction is detected, the potential of the first layer is adjusted so as to cancel the detected potential change, thus keeping a constant voltage to be applied to the PN junction between the part and the first layer. Meanwhile the PN junction between the part and the first layer functions as the parasitic diode connected to the isolation object element. Given that the voltage to be applied to the PN junction between the part and the first layer is kept at a constant value, the voltage to be applied to opposite ends of the parasitic diode will become constant. If this voltage is lower than a threshold of the parasitic diode in the reverse direction, the parasitic diode assumes a cutoff status all the time so that its junction capacity will not affect the frequency characteristic of the circuit. Therefore in an alternative form, there is provided an electronic circuit comprising: a semiconductor element around which a PN junction is formed; means for reverse biasing the PN junction around the semiconductor element to isolate the semiconductor element from other elements; and means for keeping a parasitic diode, which is adapted to be disposed between a layer constituting the PN junction around the semiconductor element and at least part of the semiconductor element, permanently in a cutoff state.

This invention may be realized in various kinds of embodiments. For example, the PN junction in connection with the isolation of elements may be reverse biased by a d.c. power source such as a battery. At that time, for keeping the parasitic diode permanently in a cutoff state, the potential to be applied to the parasitic diode from the d.c. power source should be varied in common mode with the detected potential of the first layer. The methods of varying the potential to be applied to the parasitic diode from the d.c. power source can be divided chiefly into the following two: shifting the potential to be outputted from the d.c. power source; and dropping the potential to be outputted from the d.c. power source by any means.

The former method may be realized by a circuit structure, for example, in which the potential at one terminal, out of the two terminals of the d.c. power source, opposite to the terminal to be connected with the d.c. power source and the first layer is kept floating, whereupon this floating potential is varied in common mode with the detected potential change. In this case detection of a potential change can be performed by a voltage follower whose gain is +1.

The latter method may be realized by a circuit structure, for example, in which a resistor is inserted between the d.c. power source and the first layer, and a voltage drop is caused to occur at the resistor. In this case a current to flow in the resistor must have such a value as to vary in common mode with the value of the detected potential change. The means for varying a current, which is to flow into the resistor, in conformity with the value of the detected potential change is exemplified by an element, such as a transistor, which can adjust the output current value responsive to the input potential.

The individual layers constituting the IC of this invention may be formed by the conventional process. For example, the first layer may be formed as an epitaxial layer. The IC may include an implanted layer for isolating the isolation object element from the semiconductor substrate. Further the isolation object element may be a transistor, a diode, a capacitor, etc.

The semiconductor substrate may be either a P substrate or an N substrate. If the semiconductor substrate is a P substrate, the first layer should be an N layer, the second layer a P layer, and the part of the isolation object element to be connected to the first layer as a PN junction is a P layer; the reverse biasing means applies to the first layer a potential lower than the potential at the second layer.

DETAILED DESCRIPTION

Figure 5:
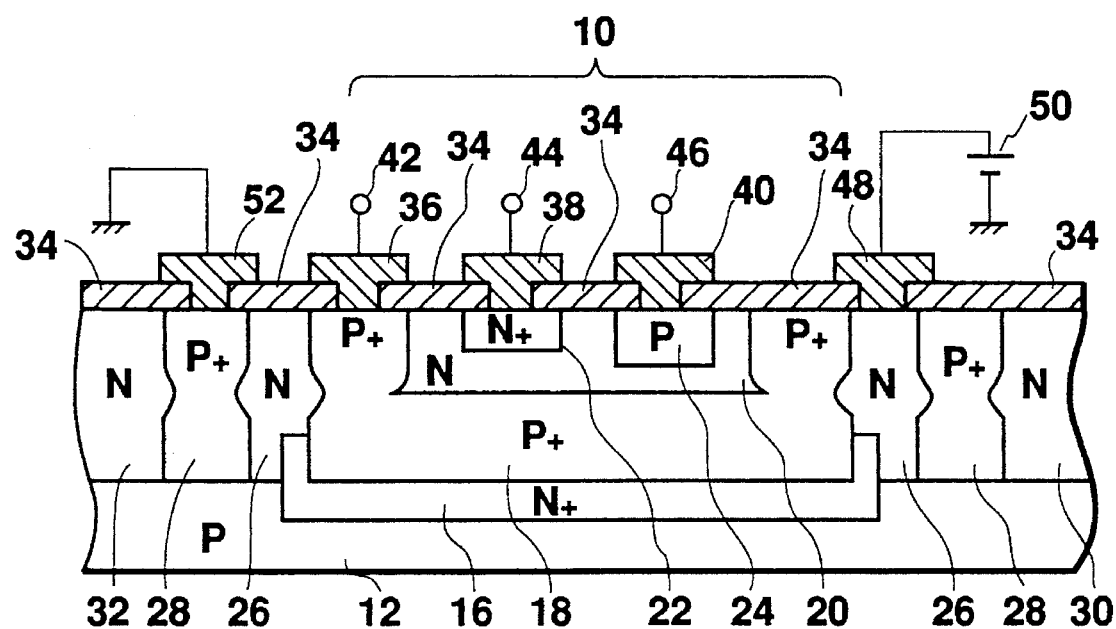
FIG. 5 is a cross-sectional diagram showing a PNP transistor which is electrically isolated from adjacent elements by reverse biasing the PN junctions around the PNP transistor.
Figure 6:
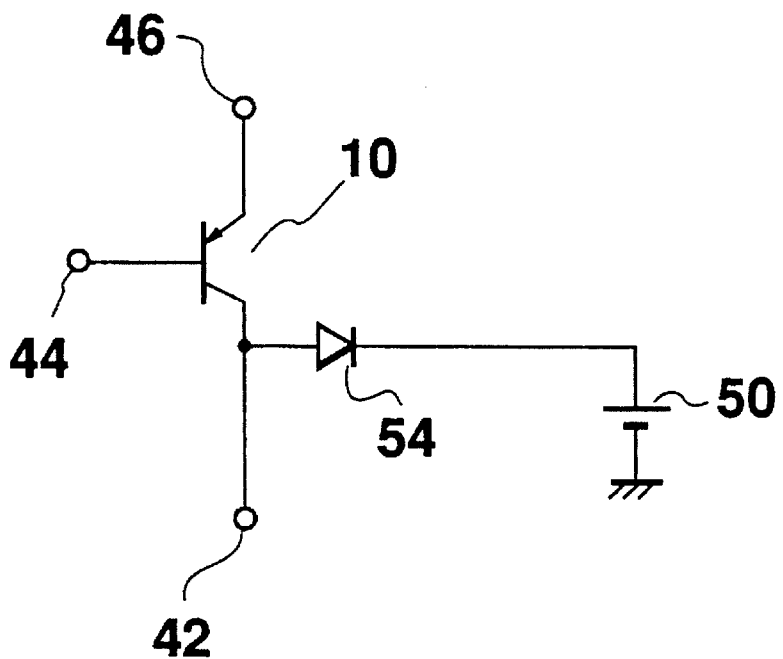
FIG. 6 is a circuit diagram showing a circuit structure in which an N layer connected to an element-isolating P layer forms a parasitic diode between the element-isolating P layer and a collector layer.

Various preferred embodiments of this invention will now be described with reference to the accompanying drawings. Each embodiment is generally similar in element structure and element-isolating structure to the semiconductor integrated circuit of FIG. 5, having a parasitic diode in the form as shown in FIG. 6. In the following description, like reference numerals designate parts or elements similar to those of FIGS. 5 and 6, and equivalent circuit diagrams are used for convenience of comparison with FIG. 6. Repetition of the description in connection with FIGS. 5 and 6 is omitted here for clarity.

Figure 1:
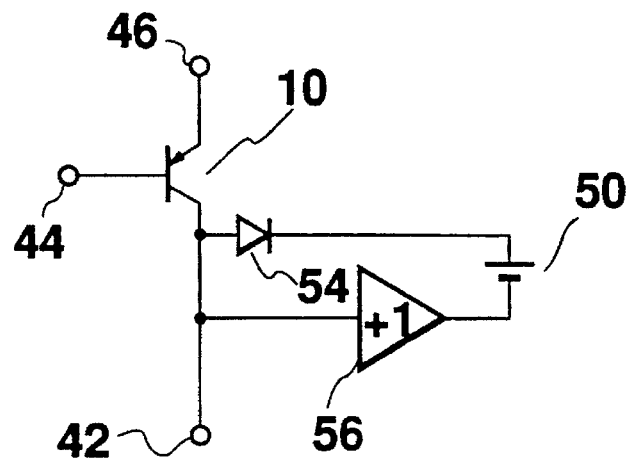
FIG. 1 is a circuit diagram showing a circuit structure according to a first embodiment of this invention.

FIG. 1 shows a partial semiconductor integrated circuit according to a first embodiment of this invention. In this embodiment a battery 50 is used differently from FIG. 6. The battery 50 applies a voltage between the conductive layers 48, 52 to reversely biasing the junction between the element-isolating layer 28 and the N epitaxial layer 34. Like FIG. 6, the potential of the P substrate 12 and the potential of the conductive layer 52 are also grounded.

In this embodiment, one end of the battery 50 is floating from the grounded potential, unlike FIG. 6, and is connected to the collector terminal 42 via the voltage follower 56. The voltage follower 56 is a d.c. amplifier whose gain is +1, and which has a function of detecting the potential of the collector terminal 42 and varying the potential at the one end of the battery 50.

More specifically, the collector potential of the PNP transistor 10 Is detected by the voltage follower 56. Since the gain of the voltage follower 56 is +1, the output potential of the voltage follower will vary in response to the potential change of the collector of the PNP transistor 10. The output terminal of the voltage follower 56 is connected to the one end of the battery 50. In this embodiment, since the connecting point between the voltage follower 56 and the battery 50 is a negative terminal of the battery 50, the potential at a positive terminal of the battery 50 varies in common mode with the collector potential of the PNP transistor 10. "Common mode" means a state in which when the collector potential of the PNP transistor 10 rises, the potential at the positive terminal of the battery 50 will rise similarly, and when the collector potential of the PNP transistor 10 is lowered, the potential at of the positive terminal of the battery 50 will be lowered similarly.

The positive terminal of the battery 50 is connected to the N epitaxial layer 26 via the conductive layer 48 as shown in FIG. 5 so that the potential at the positive terminal of the battery 50 will be applied to the N epitaxial layer 26. Since the N expitaxial layer 26 is a cathode of the parasitic diode 54 resulting from the junction between the N epitaxial layer 26 and the collector layer 18, the voltage to be applied to the parasitic diode 54 will be a potential difference between the collector of the PNP transistor 10 and the positive terminal of the battery 50.

The potential at the positive terminal of the battery 50 varies in common mode with the collector potential of the PNP transistor 10 so that the voltage to be applied to the parasitic diode 54 will be constant. If this voltage is lower than a reverse threshold voltage of the parasitic diode 54, the parasitic diode 54 will be permanently in a cutoff state so that no current will flow through the parasitic diode 54. In this status, the parasitic diode 54 will not affect the circuit operation at all and hence the frequency characteristic of the circuit is also unaffected.

Thus according to this embodiment, since the collector potential of the PNP transistor 10 is detected to vary the cathode potential of the parasitic diode 54 in common mode with the detected collector potential, it is possible to keep the voltage, which Is to be applied to the parasitic diode 54, at a constant value. Assuming that the voltage to be applied to the parasitic diode 54 is lower than a threshold voltage, it is possible to keep the parasitic diode 54 in a cutoff state, thus guaranteeing the frequency characteristic of the circuit as designed.

Figure 2:
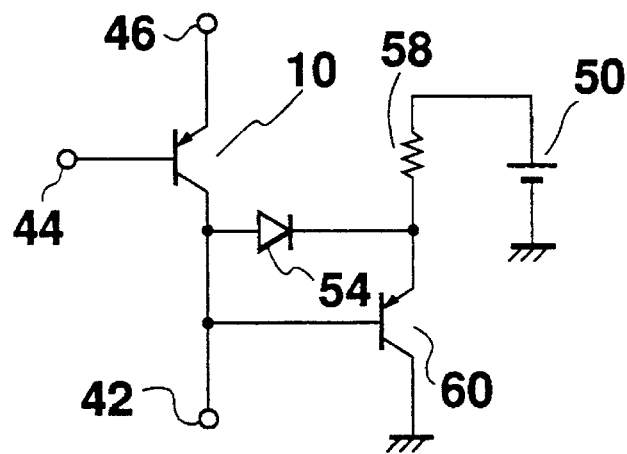
FIG. 2 is a circuit diagram showing a circuit structure according to a second embodiment.

FIG. 2 shows a partial semiconductor integrated circuit according to a second embodiment. In this embodiment, the potential at the negative terminal of the battery 50 is not floating but is fixed to the ground. The positive-terminal of the battery 50 is connected to the conductive layer 48 via a resistor 58 so that the potential of the cathode (N epitaxial layer 26) of the parasitic diode 54 will correspond to a dropped potential across the resistor 58 from the potential of the positive terminal of battery 50. The resistor 58 may be either a diffusion resistor obtained by diffusing impurities into the P substrate 12 or a resistor formed from polycrystalline silicon.

In this embodiment, another PNP transistor 60 is used in addition to the PNP transistor 10. The PNP transistor 60 may be either formed, likewise the PNP transistor 10, in the P substrate 12 or formed as a parasitic transistor in the P substrate 12.

The base of the PNP transistor 60 is connected to the collector of the PNP transistor 10. Since the collector of the PNP transistor 60 has the conductive layer 42 as an electrode, this connection is realized as the connection between the conductive layer 42 and the base electrode of the PNP transistor 60. The base electrode of the PNP transistor 60 may be formed in the same method as the base electrode 44 of the PNP transistor 10. The emitter of the PNP transistor 60 is connected to one end of the resistor 58. Specifically, the emitter electrode of the PNP transistor 60 is connected to the conductive layer 48 and may be formed in the same method as the emitter electrode 46 of the PNP transistor 10. Further the collector of the PNP transistor 60 is grounded; specifically the collector electrode of the PNP transistor 60 is connected to the conductor layer 52 and may be formed in the same method as the collector electrode 42 of the PNP transistor 52.

This embodiment can give the same results as the first embodiment. For example, when the collector potential of the PNP transistor 10 is lowered, the current flowing between the emitter and collector of the PNP transistor 60 is increased. The voltage drop due to the resistor 58 will thereby be increased so that the cathode potential of the parasitic diode 54 will be lowered by the amount of the voltage drop due to the resistor 58. Therefore the voltage to be applied to the opposite ends of the parasitic diode 54 will not vary, irrespective of the lowering of the collector potential of the PNP transistor 10.

Figure 3:
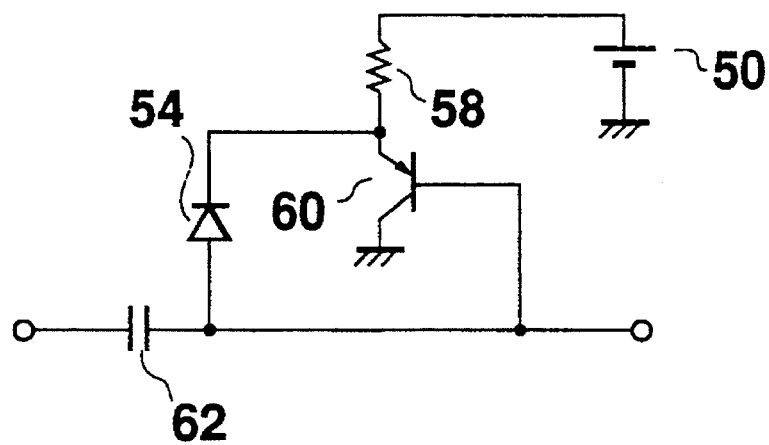
FIG. 3 is a circuit diagram showing a circuit structure according to a third embodiment.

FIG. 3 shows a partial semiconductor integrated circuit according to a third embodiment. In this embodiment, the object element to be isolated from adjacent elements is a capacitor 62 rather than the PNP transistor 10. For forming the capacitor 62, an element-isolating structure is formed in the same method as the case shown in FIG. 5, and then a dielectric layer is formed on the surface of the element-isolating structure by the known method such as surface nitrization. One electrode of the capacitor 62 is a P layer, and the epitaxial layer to which the positive potential from the battery 50 is to be applied makes a PN junction with this P layer. Therefore as represented in an equivalent circuit, the parasitic diode 54 will be formed between the one electrode of the capacitor 62 and the positive terminal of the battery 50. This invention can be adopted also in this case if an emitter follower having the PNP transistor 60 and the resistor 58 is provided between the parasitic diode 54 and the battery 50, likewise in the second embodiment.

Figure 4:
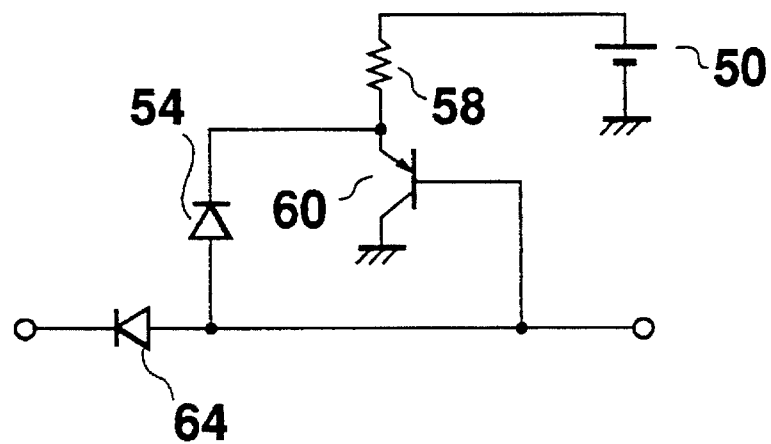
FIG. 4 is a circuit diagram showing a circuit structure according to a fourth embodiment.

FIG. 4 shows a partial semiconductor integrated circuit according to a fourth embodiment. In this embodiment, the object element to be isolated from adjacent elements is a diode 64 rather than the PNP transistor 10. The anode of the diode 64 is a P layer, and the epitaxial layer to which the positive potential from the battery 50 is to be applied makes a PN junction with this P layer. Therefore as represented in an equivalent circuit, a parasitic diode 54 is formed between the anode of the diode 64 and the positive terminal of the battery 50. This invention can be adopted also in this case if an emitter follower having the PNP transistor 60 and the resistor 58 is provided between the parasitic diode 54 and the battery 50, likewise in the second embodiment.

The object element to be isolated may be an NPN transistor.

As mentioned above, according to this invention, since the voltage to be applied to the parasitic diode is kept constant so that the parasitic diode will assume a cutoff state permanently, it is possible to prevent the diode from affecting the frequency characteristic of the circuit.

What is claimed is:

1. A semiconductor integrated circuit comprising:

a) a semiconductor substrate;

b) an isolated transistor including a base element, a collector element and an emitter element formed in said semiconductor substrate isolated from other elements formed in said semiconductor substrate;

(c) a first layer formed in said semiconductor substrate and surrounding said isolated transistor, at least said collector element of said isolated transistor being in contact with the first layer to form a PN junction;

(d) a second layer formed in said semiconductor substrate and operatively connected to said first layer to form a PN junction;

(e) means for reverse biasing the junction of said first and second layers;

(f) means for detecting a potential change at the PN junction between said isolated transistor and said first layer; and (g) means for adjusting the potential of said first layer in such a manner that any detected potential change may be canceled.

2. A semiconductor integrated circuit according to claim 1, wherein said reverse biasing means is a d.c. power source connected at one end to said first layer, said potential adjusting means being operable for varying the potential at the other end of said d.c. power source in common mode with the detected potential change.

3. A semiconductor integrated circuit according to claim 2, wherein said potential change detecting means includes a voltage follower with a gain of +1 connected to the PN junction of said isolated transistor with said first layer.

4. A semiconductor integrated circuit according to claim 1, wherein said reverse biasing means is a d.c. power source connected between said first and second layers, said potential adjusting means is a resistor located between said d.c. power source and said first layer for causing a voltage drop according to the detected potential change.

5. A semiconductor integrated circuit according to claim 4, wherein said potential change detecting means includes an element whose output current may vary according to the potential difference across the junction of said isolated transistor and said first layer.

6. A semiconductor integrated circuit according to claim 1, wherein said first layer is an epitaxial layer formed in said semiconductor substrate.

7. A semiconductor integrated circuit according to claim 1, further comprising an implanted layer for isolating said isolated transistor from said semiconductor substrate.

8. A semiconductor integrated circuit according to claim 1, wherein said semiconductor substrate is a P substrate, said first layer is an N layer, said second layer is a P layer, said collector element is a P layer, and said reverse biasing means applies to said first layer a higher potential than that to said second layer.

9. A semiconductor-element isolating structure comprising:

(a) an isolated transistor element including a base element, a collector element and an emitter element, isolated from other elements;

(b) a first layer surrounding and adapted to be connected with a part of said isolated transistor, at least said collector element of said isolated transistor being in contact with said first layer to form a PN junction;

(c) a second layer connected to said first layer to form a PN junction;

(d) means for reverse biasing the PN junction of said first and second layers;

(e) means for detecting a potential change at the PN junction between said isolated transistor and said first layer; and (f) means for adjusting the potential of said first layer to cancel any detected potential change.

10. An electronic circuit comprising:

(a) a transistor around which a PN junction is formed;

(b) means for reverse biasing the PN junction around said transistor to isolate said transistor from other elements; and (c) means for keeping a parasitic diode, located between a layer constituting the PN junction around said transistor and at least part of said transistor, reverse biased and permanently in a cutoff state.

11. An electronic circuit according to claim 10, wherein said cutoff-state keeping means is operable to keep a constant voltage between opposite ends of said parasitic diode, said constant voltage being less than a threshold of said parasitic diode.

12. A semiconductor integrated circuit comprising:

(a) a semiconductor substrate;

(b) an isolated capacitor formed in said semiconductor substrate isolated from other elements formed in said semiconductor substrate;

(c) a first layer formed in said semiconductor substrate and surrounding said isolated capacitor and connected with a part of said isolated capacitor to form a PN junction;

(d) a second layer formed in said semiconductor substrate and connected with said first layer to form a PN junction;

(e) means for reverse biasing the junction of said first and second layers;

(f) means for detecting a potential change at the PN junction between said isolated capacitor and said first layer; and (g) means for adjusting the potential of said first layer to cancel any detected potential change.

13. A semiconductor integrated circuit according to claim 12, wherein said reverse biasing means is a d.c. power source connected at one end to said first layer, said potential adjusting means varying the potential at the other end of said d.c. power source in common mode with the detected potential change.

14. A semiconductor integrated circuit according to claim 13, wherein said potential change detecting means includes a voltage follower with a gain of +1 connected to the PN junction of said isolated capacitor with said first layer.

15. A semiconductor integrated circuit according to claim 12, wherein said reverse biasing means is a d.c. power source connected between said first and second layers, said potential adjusting means is a resistor located between said d.c. power source and said first layer for causing a voltage drop according to the detected potential change.

16. A semiconductor integrated circuit according to claim 15, wherein said potential change detecting means includes an element whose output current varies according to the potential at the junction between said isolated capacitor and said first layer.

17. A semiconductor integrated circuit according to claim 12, wherein said first layer is an epitaxial layer formed in said semiconductor substrate.

18. A semiconductor integrated circuit according to claim 12, further comprising an implanted layer for isolating said isolated capacitor from said semiconductor substrate.

19. A semiconductor integrated circuit according to claim 12, wherein said semiconductor substrate is a P substrate, said first layer is an N layer, said second layer is a P layer, said part of said isolated capacitor is a P layer, and said reverse biasing means applies to said first layer a higher potential than that to said second layer.

20. A semiconductor integrated circuit comprising:

(a) a semiconductor substrate;

(b) an isolated diode formed in said semiconductor substrate isolated from other elements formed in said semiconductor substrate;

(c) a first layer formed in said semiconductor substrate, surrounding said isolated diode and connected with a part of said isolated diode forming a PN junction;

(d) a second layer formed in said semiconductor substrate connected with said first layer to form a PN junction;

(e) means for reverse biasing the junction of said first and second layers;

(f) means for detecting a potential change at the PN junction between said isolated diode and said first layer; and (g) means for adjusting the potential of said first layer to cancel any detected potential change.

21. A semiconductor integrated circuit according to claim 20, wherein said reverse biasing means is a d.c. power source connected at one end to said first layer, said potential adjusting means varies the potential at the other end of said d.c. power source in common mode with the detected potential change.

22. A semiconductor integrated circuit according to claim 21, wherein said potential change detecting means includes a voltage follower with a gain of +1 connected to the PN junction formed by said isolated diode and said first layer.

23. A semiconductor integrated circuit according to claim 20, wherein said reverse biasing means is a d.c. power source connected between said first and second layers, said potential adjusting means is a resistor located between said d.c. power source and said first layer for causing a voltage drop according to the detected potential change.

24. A semiconductor integrated circuit according to claim 23, wherein said potential change detecting means includes an element whose output current varies according to the potential at the junction between said isolated diode and said first layer.

25. A semiconductor integrated circuit according to claim 20, wherein said first layer is an epitaxial layer formed in said semiconductor substrate.

26. A semiconductor integrated circuit according to claim 20, further comprising an implanted layer for isolating said isolated diode from said semiconductor substrate.

27. A semiconductor integrated circuit according to claim 20, wherein said semiconductor substrate is a P substrate, said first layer is an N layer, said second layer is a P layer, said part of said isolated diode is a P layer, and said reverse biasing means applies to said first layer a higher potential than that to said second layer.

28. A semiconductor-element isolating structure comprising:

(a) an isolated diode, isolated from other elements;

(b) a first layer surrounding said isolated diode connected with a part of said isolated diode to form a PN junction;

(c) a second layer connected to said first layer to form a PN junction;

(d) means for reverse biasing the PN junction of said first and second layers;

(e) means for detecting a potential change at the PN junction between said isolated diode and said first layer; and (f) means for adjusting the potential of said first layer so as to cancel any detected potential change.

29. An electronic circuit comprising:

(a) a first diode around which a PN junction is formed;

(b) means for reverse biasing the PN junction around said first diode to isolate said first diode from other elements; and (c) means for keeping a parasitic diode, located between a layer constituting the PN junction around said first diode and at least part of said first diode reverse biased and, permanently in a cutoff state.

30. An electronic circuit according to claim 29, wherein said keeping means keeps a voltage, which is applied to said parasitic diode, constantly less than a threshold of said parasitic diode.

31. A semiconductor-element isolating structure comprising:

(a) an isolated capacitor, isolated from other elements;

(b) a first layer surrounding said isolated capacitor connected with a part of said isolated capacitor to form a PN junction;

(c) a second layer connected to said first layer to form a PN junction;

(d) means for reverse biasing the PN junction of said first and second layers;

(e) means for detecting a potential change at the PN junction between said isolated capacitor and said first layer; and (f) means for adjusting the potential of said first layer so as to cancel any detected potential change.

32. An electronic circuit comprising:

(a) a capacitor around which a PN junction is formed;

(b) means for reverse biasing the PN junction around said capacitor to isolate said capacitor from other elements; and (c) means for keeping a parasitic diode, located between a layer constituting the PN junction around said capacitor and at least part of said capacitor reverse biased and, permanently in a cutoff state.

33. An electronic circuit according to claim 32, wherein said cutoff-state keeping means keeps a voltage, which is applied to said parasitic diode, constantly less than a threshold of said parasitic diode.

* * * * *